(12) United States Patent
Seddon et al.

(10) Patent No.: US 10,741,484 B2
(45) Date of Patent: Aug. 11, 2020

(54) STACKED SEMICONDUCTOR DEVICE STRUCTURE AND METHOD

(71) Applicant: SEMICONDUCTOR COMPONENTS INDUSTRIES, LLC, Phoenix, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/131,331

(22) Filed: Sep. 14, 2018

(65) Prior Publication Data

US 2019/0013264 A1    Jan. 10, 2019

Related U.S. Application Data

(60) Division of application No. 15/614,840, filed on Jun. 6, 2017, now Pat. No. 10,163,772, which is a
(Continued)

(51) Int. Cl.
*H01L 23/495* (2006.01)
*H01L 23/498* (2006.01)
(Continued)

(52) U.S. Cl.
CPC .. *H01L 23/49827* (2013.01); *H01L 21/02035* (2013.01); *H01L 21/288* (2013.01); *H01L 21/304* (2013.01); *H01L 21/308* (2013.01); *H01L 21/3065* (2013.01); *H01L 21/3083* (2013.01); *H01L 21/486* (2013.01); *H01L 21/4825* (2013.01); *H01L 21/4853* (2013.01); *H01L 21/565* (2013.01);
(Continued)

(58) Field of Classification Search
CPC ............... H01L 21/78; H01L 23/3114; H01L 23/49575; H01L 25/43; H01L 25/0657; H01L 25/117
USPC ....................................................... 257/686
See application file for complete search history.

(56) References Cited

U.S. PATENT DOCUMENTS 5,557,508 A * 9/1996 Sato ..................... H05K 3/3405
174/377
5,619,070 A * 4/1997 Kozono ............. H01L 23/3121
257/692
(Continued)

FOREIGN PATENT DOCUMENTS

JP    2002076326 A    3/2002
JP    2002368218 A    12/2002
(Continued)

*Primary Examiner* — Nitin Parekh
(74) *Attorney, Agent, or Firm* — Kevin B. Jackson

(57) ABSTRACT

A method of forming stacked semiconductor device structure includes providing a first semiconductor device and a second semiconductor device. The first semiconductor device includes a recessed region bounded by sidewall portions and a conductive layer disposed adjoining at least portions of the recessed region. The method includes electrically connecting the second semiconductor device to the conductive layer within the recessed region such that at least a portion of the second semiconductor device is disposed within the recessed region.

20 Claims, 16 Drawing Sheets

Related U.S. Application Data continuation of application No. 15/219,000, filed on Jul. 25, 2016, now Pat. No. 9,711,434.

(60) Provisional application No. 62/219,666, filed on Sep. 17, 2015.

(51) Int. Cl.

| | | |
|---|---|---|
| *H01L 21/48* | (2006.01) | |
| *H01L 23/00* | (2006.01) | |
| *H01L 21/3065* | (2006.01) | |
| *H01L 21/78* | (2006.01) | |
| *H01L 21/67* | (2006.01) | |
| *H01L 21/66* | (2006.01) | |
| *H01L 21/56* | (2006.01) | |
| *H01L 23/31* | (2006.01) | |
| *H02M 3/158* | (2006.01) | |
| *H01L 23/482* | (2006.01) | |
| *H01L 25/065* | (2006.01) | |
| *H01L 25/00* | (2006.01) | |
| *H01L 23/544* | (2006.01) | |
| *H01L 21/02* | (2006.01) | |
| *H01L 21/304* | (2006.01) | |
| *H01L 21/308* | (2006.01) | |
| *H01L 27/146* | (2006.01) | |
| *H01L 21/288* | (2006.01) | |
| *H01L 21/683* | (2006.01) | |
| *H01L 21/768* | (2006.01) | |
| *H01L 23/48* | (2006.01) | |
| *H01L 27/02* | (2006.01) | |
| *H01L 27/088* | (2006.01) | |
| *H01L 27/14* | (2006.01) | |
| *H01L 29/08* | (2006.01) | |
| H01L 23/15 | (2006.01) | |
| H01L 23/367 | (2006.01) | |
| H01L 23/14 | (2006.01) | |

(52) U.S. Cl.
CPC .... *H01L 21/67069* (2013.01); *H01L 21/6835* (2013.01); *H01L 21/76877* (2013.01); *H01L 21/76898* (2013.01); *H01L 21/78* (2013.01); *H01L 22/12* (2013.01); *H01L 22/26* (2013.01); *H01L 23/3107* (2013.01); *H01L 23/3114* (2013.01); *H01L 23/481* (2013.01); *H01L 23/4822* (2013.01); *H01L 23/4951* (2013.01); *H01L 23/49503* (2013.01); *H01L 23/49541* (2013.01); *H01L 23/49562* (2013.01); *H01L 23/49575* (2013.01); *H01L 23/49811* (2013.01); *H01L 23/49838* (2013.01); *H01L 23/49866* (2013.01); *H01L 23/544* (2013.01); *H01L 23/562* (2013.01); *H01L 24/00* (2013.01); *H01L 24/05* (2013.01); *H01L 25/0655* (2013.01); *H01L 25/0657* (2013.01); *H01L 25/50* (2013.01); *H01L 27/0207* (2013.01); *H01L 27/088* (2013.01); *H01L 27/14* (2013.01); *H01L 27/14683* (2013.01); *H01L 29/0847* (2013.01); *H02M 3/158* (2013.01); *H01L 23/147* (2013.01); *H01L 23/15* (2013.01); *H01L 23/3677* (2013.01); *H01L 23/49816* (2013.01); *H01L 27/14625* (2013.01); *H01L 27/14685* (2013.01); *H01L 2221/68327* (2013.01); *H01L 2223/5446* (2013.01); *H01L 2223/54426* (2013.01); *H01L 2224/0401* (2013.01); *H01L 2224/04042* (2013.01); *H01L 2224/05083* (2013.01); *H01L 2224/05084* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05172* (2013.01); *H01L 2224/05184* (2013.01); *H01L 2224/13025* (2013.01); *H01L 2224/13111* (2013.01); *H01L 2224/13116* (2013.01); *H01L 2225/06555* (2013.01); *H01L 2225/06593* (2013.01); *H01L 2225/06596* (2013.01); *H01L 2924/13055* (2013.01); *H01L 2924/13091* (2013.01); *H01L 2924/3511* (2013.01)

(56) References Cited

U.S. PATENT DOCUMENTS

| | | | | |
|---|---|---|---|---|
| 5,724,230 | A * | 3/1998 | Poetzinger | H01L 23/10 257/709 |
| 5,760,478 | A * | 6/1998 | Bozso | H01L 24/73 257/777 |
| 5,808,878 | A | 9/1998 | Saito et al. | |
| 5,875,100 | A * | 2/1999 | Yamashita | H01L 24/24 257/723 |
| 5,973,392 | A * | 10/1999 | Senba | H01L 25/0652 257/685 |
| 5,977,640 | A | 11/1999 | Bertin et al. | |
| 6,005,778 | A | 12/1999 | Spielberger et al. | |
| 6,104,062 | A | 8/2000 | Zeng | |
| 6,147,401 | A * | 11/2000 | Solberg | H01L 25/0657 257/668 |
| 6,150,724 | A | 11/2000 | Wenzel et al. | |
| 6,343,019 | B1 | 1/2002 | Jiang et al. | |
| 6,489,686 | B2 * | 12/2002 | Farooq | H01L 24/11 257/686 |
| 6,659,512 | B1 | 12/2003 | Harper et al. | |
| 7,170,183 | B1 | 1/2007 | Kim et al. | |
| 8,030,743 | B2 | 10/2011 | Liu et al. | |
| 2002/0074652 | A1 | 6/2002 | Pierce | |
| 2002/0139577 | A1 * | 10/2002 | Miller | H01L 21/76898 174/261 |
| 2004/0245652 | A1 | 12/2004 | Ogata | |
| 2006/0180904 | A1 | 8/2006 | Ong | |
| 2006/0289967 | A1 | 12/2006 | Heck et al. | |
| 2009/0065911 | A1 | 3/2009 | Wu et al. | |
| 2009/0160595 | A1 | 6/2009 | Feng et al. | |
| 2012/0018895 | A1 * | 1/2012 | Oganesian | H01L 23/481 257/773 |
| 2012/0181706 | A1 | 7/2012 | Zeng et al. | |
| 2012/0208324 | A1 | 8/2012 | Harata et al. | |
| 2013/0299848 | A1 | 11/2013 | Fuergut et al. | |
| 2014/0264804 | A1 | 9/2014 | Terrill et al. | |
| 2014/0332942 | A1 | 11/2014 | Kanemoto | |
| 2017/0084545 | A1 * | 3/2017 | Seddon | H01L 27/14 |
| 2017/0162403 | A1 | 6/2017 | Terrill et al. | |
| 2017/0207182 | A1 * | 7/2017 | Ho | H01L 23/055 |

FOREIGN PATENT DOCUMENTS

| | | |
|---|---|---|
| JP | 2003243356 A | 8/2003 |
| JP | 2004281551 A | 10/2004 |
| JP | 2007208074 A | 8/2007 |
| JP | 2010205761 A | 9/2010 |

\* cited by examiner

STACKED SEMICONDUCTOR DEVICE STRUCTURE AND METHOD

CROSS-REFERENCE TO RELATED APPLICATIONS

This application is a divisional application of U.S. patent application Ser. No. 15/614,840 filed on Jun. 6, 2018 and issued as U.S. Pat. No. 10,163,772 on Dec. 25, 2018, which is a continuation application of U.S. patent application Ser. No. 15/219,000 filed on Jul. 25, 2016 and issued as U.S. Pat. No. 9,711,434 on Jul. 18, 2017, which claims priority to U.S. Provisional Application No. 62/219,666 filed on Sep. 17, 2015, the content of which is hereby incorporated by reference.

BACKGROUND

The present invention relates, in general, to electronics and, more particularly, to semiconductor device structures and methods of manufacture.

Metal-oxide semiconductor field effect transistors (MOSFETs) are a common type of power switching device widely used in industry. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source region and the drain region. In the on state, on-state resistance (Rdson) is an important performance parameter, and in the off state, breakdown voltage (BVdss) is an important performance parameter.

FIG. 1 shows a simplified schematic of an example application using MOSFETs in a DC/DC buck regulator configuration 1. DC/DC buck regulators are used to step down voltage (while stepping up current) from the voltage supply to the voltage output. Such configurations are used in, for example, computing applications, game console applications, consumer Point of Load (PoL) applications, as well as others. DC/DC bucker regulator configuration 1 includes a low-side MOSFET 2, a high-side MOSFET 3, a driver device 6, and a pulse width modulation (PWM) device 7. MOSFET 2 includes a source 2A, a drain 2B connected to a ground node 5, and a gate electrode 2C connected to driver 6. MOSFET 3 includes a source 3A connected to a power or supply node 4, a drain 3B connected to source 2A of MOSFET 2, and a gate electrode 3C connected to driver device 6. An output node or switch node 8 is provided between drain 3B and source 2A. Switch node 8 typically is connected to at least one energy storage element, such as a capacitor, an inductor, or a combination of the two, which is configured to provide the desired output voltage.

In the past, the high-side MOSFET 3 and the low-side MOSFET 2 have either been packaged as separate devices, or have been co-packaged on a lead frame with the two devices being disposed in a laterally separated configuration and interconnected with wires or clips. Both of these approaches have had limitations including: increased usage of application board space, decreased efficiency, increased assembly costs, increased interconnect resistance, increased lag time, increased device on-resistance, and increased parasitics, among others.

Accordingly, it is desirable to have a method and structure for assembling power semiconductor devices, such as MOSFET devices. Also, it would be beneficial if the method and structure could provide a low cost means for assembling or configuring a low-side MOSFET and a high-side MOSFET that overcomes the issues identified above as well as others.

Figure 1:
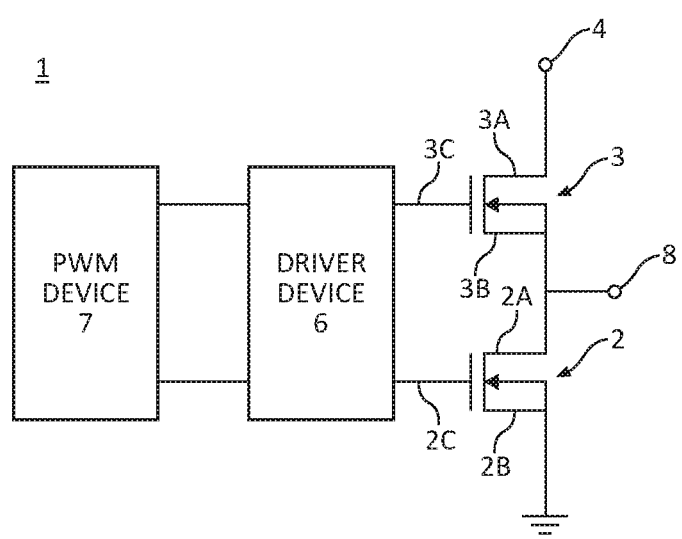
FIG. 1 shows a schematic of a DC/DC buck regulator configuration as an example application for the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor.

Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a first semiconductor device having a recessed portion or notch portion disposed in a major surface opposite to the location of active device regions. In one embodiment, the recessed portion is bounded by a pair of opposing sidewall portions that extend outward from the recessed portion. In another embodiment, a single sidewall portion is provided. In a further embodiment, more than two sidewall portions are provided. A conductive material is disposed within the recessed portion. A second semiconductor device is physically connected to the conductive material at least partially within the recessed portion to provide a stacked semiconductor device structure or stacked die configuration. In one embodiment, the first semiconductor device and the second semiconductor device are MOSFET devices configured as a high-side device and a low-side device for a DC/DC power regulation application. In another embodiment, a driver device is either co-packaged with the stacked-die configuration or is further stacked adjoining the stacked-die configuration. In some embodiments, a conductive connective structure is provided to allow for electrically sensing characteristics of the second semiconductor device. The present embodiments provide for, among other things, smaller package footprints and the elimination of device interconnects, such as conductive clips between the MOSFETs, which saves on costs, reduces manufacturing complexity, and improves electrical performance (e.g., reduced electrical resistance and/or reduced parasitics).

More particularly, in one embodiment a stacked semiconductor device structure comprises a first semiconductor device comprising a first singulated region of semiconductor material having a first major surface and a second major surface opposite to the first major surface, the second major surface comprising a recessed surface portion bounded by opposing sidewall portions extending outward from the recessed surface portion in cross-sectional view to define a recessed portion, the sidewall portions having outer surfaces defining peripheral edge segments of the first singulated region of semiconductor material, the sidewall portions further comprising inner surfaces opposite to the outer surfaces; a first active device region disposed adjacent to the first major surface; and a first conductive layer disposed adjoining the recessed surface portion. The structure includes a second semiconductor device comprising a second singulated region of semiconductor material having a third major surface and a fourth major surface opposite to the third major surface; and a second active device region disposed adjacent to the third major surface. A first portion of the second semiconductor device is electrically connected to the first conductive layer within the recessed portion. At least a portion of the second semiconductor device is disposed within the recessed region. In an alternative embodiment, only one sidewall portion is used.

In another embodiment, a method of manufacturing a semiconductor device comprises providing a first semiconductor device comprising a first singulated region of semiconductor material having a first major surface and a second major surface opposite to the first major surface, the second major surface comprising a recessed surface portion bounded by a first sidewall portion extending outward from the recessed surface portion in cross-sectional view to define a recessed region, the first sidewall portion having an outer surface defining a peripheral edge segment of the first singulated region of semiconductor material, the first sidewall portion further comprising an inner surface opposite to the outer surface; a first active device region disposed adjacent to the first major surface; and a first conductive layer disposed adjoining at least the recessed surface portion. The method includes providing a second semiconductor device comprising a second singulated region of semiconductor material having a third major surface and a fourth major surface opposite to the third major surface; and a second active device region disposed adjacent to the third major surface. The method includes electrically coupling a first portion of the second semiconductor device to the first conductive layer within the recessed surface portion.

In a further embodiment, a method of manufacturing a stacked semiconductor device structure comprising providing a semiconductor substrate having first and second opposing major surfaces, a first semiconductor device having a first active device region formed as part of the semiconductor substrate adjacent the first major surface. The method includes forming a recessed surface portion extending inward from the second major surface, the recessed surface portion disposed adjacent the first semiconductor device, the recessed surface portion being bounded by sidewall portions, each sidewall portion extending outward from the recessed surface portion. The method includes providing a first conductive layer within the recessed surface portion. The method includes singulating the semiconductor substrate through the sidewall portions to provide the first semiconductor device as a singulated structure. The method includes providing a second semiconductor device comprising a semiconductor material having a third major surface and a fourth major surface opposite to the third major surface; and a second active device region disposed adjacent to the third major surface. The method includes electrically connecting a first portion of the second active device region to the first conductive layer within the recessed surface portion.

Figure 2:
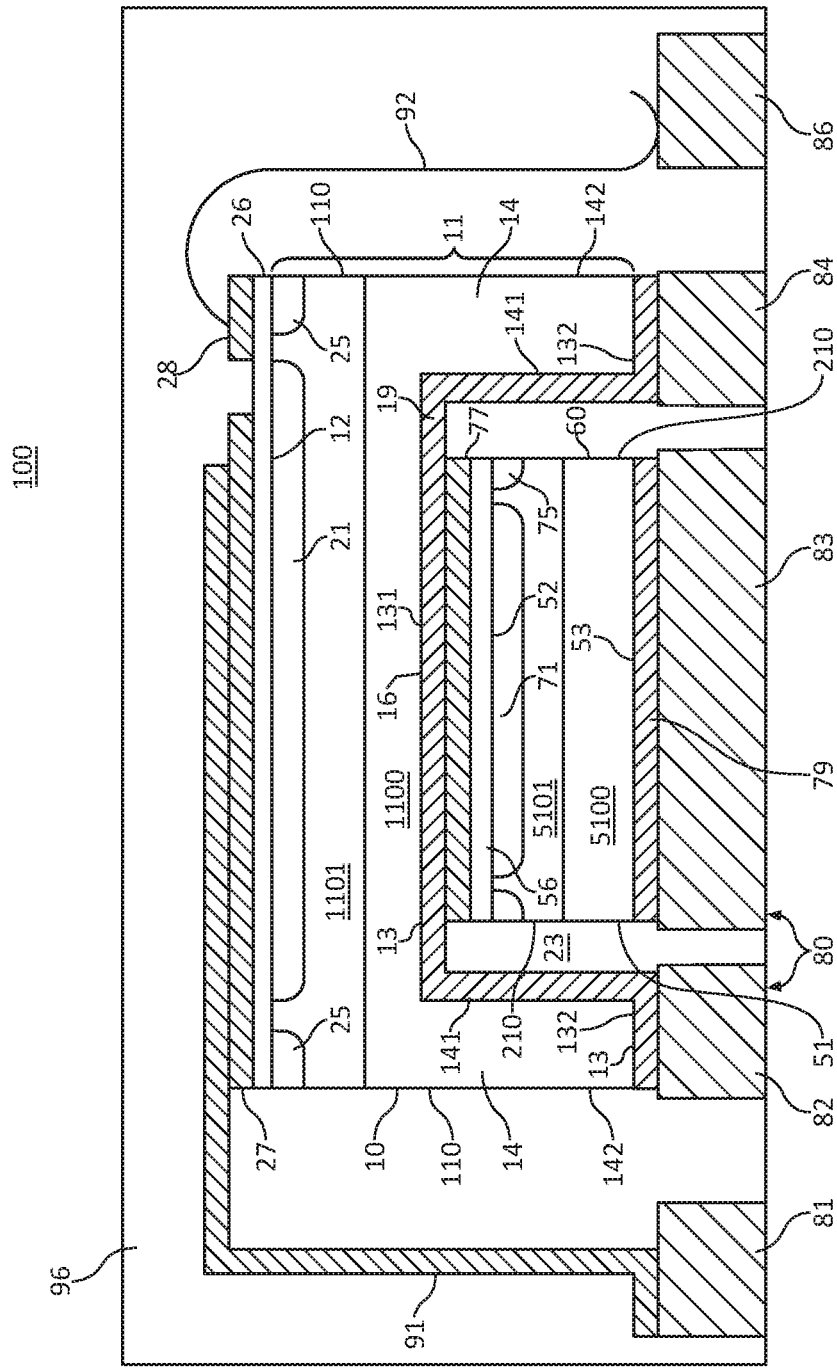
FIG. 2 illustrates an enlarged cross-sectional view of a stacked semiconductor device structure in accordance with an embodiment of the present invention taken along reference line 2'-2' of FIG. 3.
Figure 3:
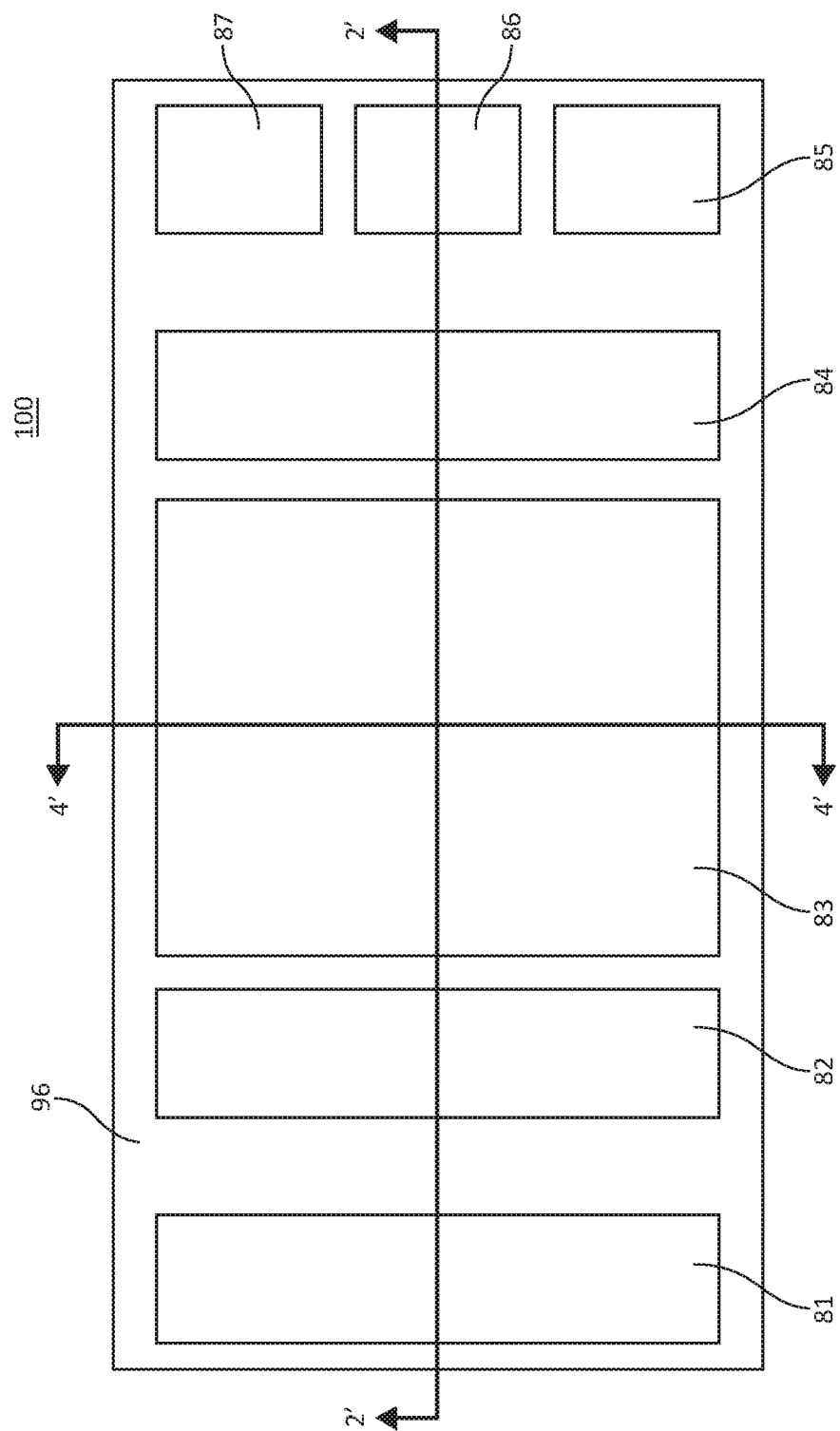
FIG. 3 illustrates a bottom view of the embodiments of FIGS. 2 and 4.
Figure 4:
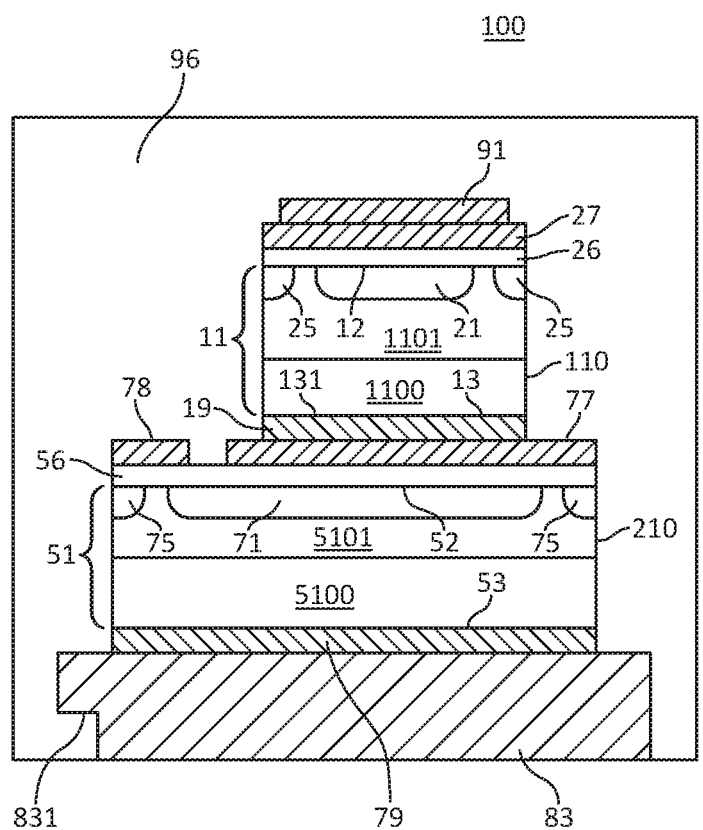
FIG. 4 illustrates an enlarged cross-sectional view of the embodiment of FIGS. 2 and 3 taken along reference line 4'-4' of FIG. 3.
Figure 5:
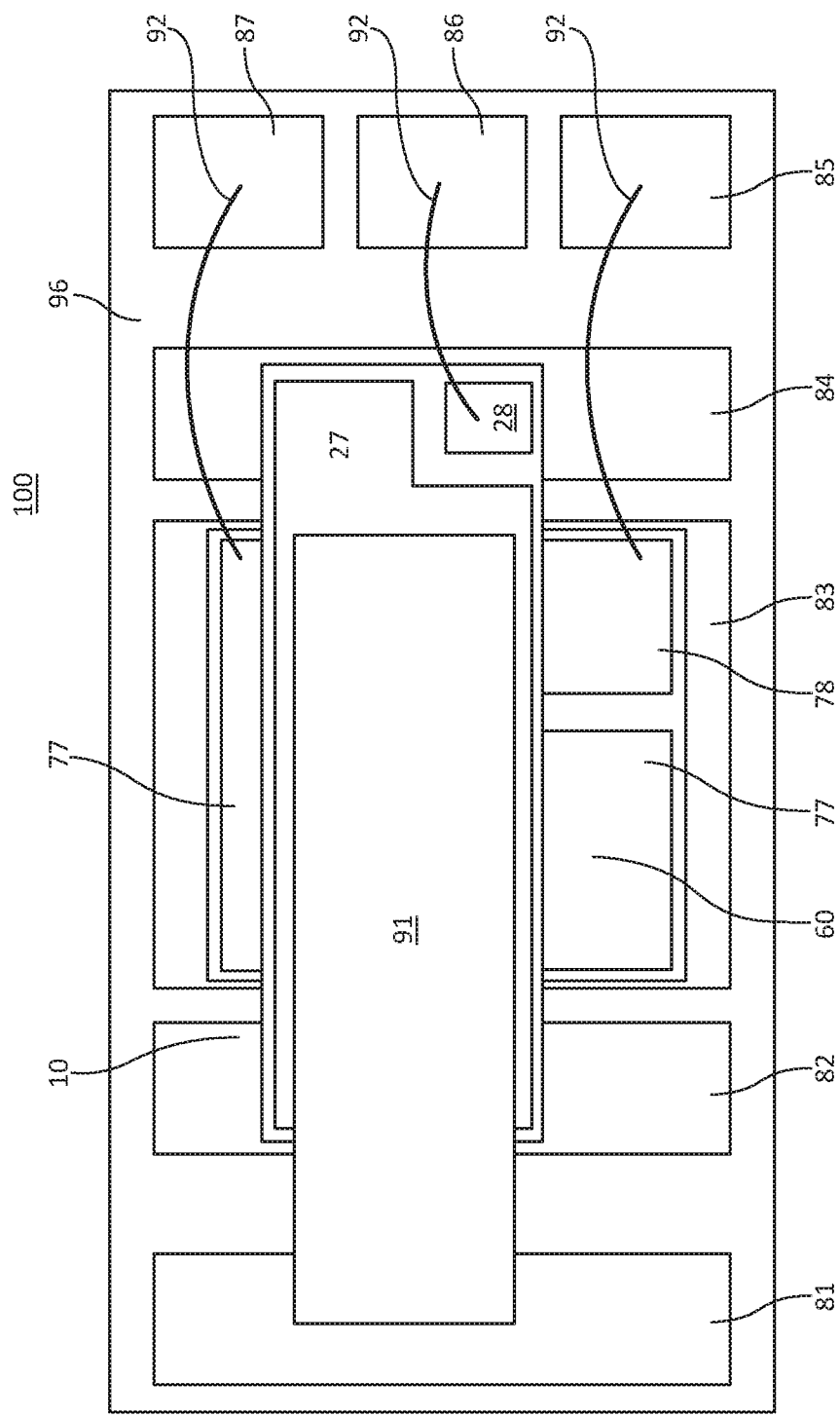
FIG. 5 illustrates a top view of a stacked semiconductor device structure in accordance with an embodiment of the present invention.

FIGS. 2-5 illustrate various views of a stacked semiconductor device structure 100 in accordance with a first embodiment. FIG. 2 illustrates a cross-sectional view of device 100 structure taken along reference line 2'-2' of FIG. 3; FIG. 3 illustrates a bottom view of device structure 100; and FIG. 4 illustrates another cross-sectional view of device structure 100 taken along reference line 4'-4' of FIG. 3. FIG. 5 illustrates a top view of device structure 100 with package body 96 illustrated as transparent. In accordance with the present embodiment, stacked semiconductor device structure 100 includes a first semiconductor device 10 having a recessed portion 23 or recessed region 23, a second semiconductor device 60 physically disposed at least partially within recessed portion 23 and electrically connected to first semiconductor device 10, a conductive substrate 80 or conductive lead frame 80, and a package body 96 encapsulating first semiconductor device 10, second semiconductor device 60, and at least portions of conductive substrate 80. Portions of conductive substrate 80 can be exposed to the outside of package body 96. In an alternative embodiment, conductive substrate 80 is not used and portions of first semiconductor device 10, second semiconductor device 60, and conductive connective structures used to interconnect the devices to the outside are exposed through package body 96.

Still with reference to FIGS. 2-5, in one embodiment first semiconductor device 10 comprises a singulated semiconductor device 10, an insulated gate field effect transistor (IGFET) 10, MOSFET 10, power semiconductor device 10, or switching device 10. First semiconductor device 10 includes a singulated body of semiconductor material 11, body of semiconductor material 11, or singulated semiconductor substrate 11, which, in one embodiment, is formed from a semiconductor wafer that has been singulated along singulation lines to provide singulated edges 110. Further description of an example singulation process operation will be provided later. In one embodiment, singulated body of semiconductor material 11 includes a substrate portion 1100 and a semiconductor layer portion 1101, which in some embodiments can be an epitaxial layer.

Singulated body of semiconductor material 11 includes a first major surface 12 and a second major surface 13 opposite to first major surface 12. Second major surface 13 includes a recessed surface portion 16 defining a portion 131 of second major surface 13. Recessed surface portion 16 is bounded by opposing sidewall portions 14 or opposing interconnect portions 14 extending outward from portion 131 of region of semiconductor material 11 in cross-sectional view. In one embodiment, sidewall portions 14 define portions 132 of second major surface 13. Portions 132 can also be referred to as tip portions 132 of sidewall portions 14, which are distal to portion 131 of second major surface 13. Stated another way, portions 132 of second major surface 13 and portion 131 of second major surface 13 lie on or within different planes. In accordance with the present embodiment, sidewall portions 14 include inner sidewall surfaces 141 or inner surfaces 141 and outer sidewall surfaces 142 or outer surfaces 142 opposite to inner surfaces 141. In accordance with the present embodiment, outer surfaces 142 are defined by singulated edges 110 after first semiconductor device 10 is singulated from a semiconductor wafer. Further, in some embodiments sidewall portions 14 are configured as interconnect structures or localized interconnect structures for first semiconductor device 10. More particularly, in some embodiments, sidewall portions 14 facilitate the electrical connection of first semiconductor device 10 to a next level of assembly, such as a printed circuit board, a leadframe, or another semiconductor device.

First semiconductor device 10 further includes active device region 21 and termination regions 25, which can be disposed adjacent first major surface 12 of singulated region of semiconductor material 11. In one embodiment, active region 21 can include a plurality of N-type conductivity regions and/or a plurality of P-type conductivity regions configured to form power semiconductor device structures, such as insulated gate field effect transistor (IGFET) devices, metal-oxide semiconductor field effect transistors (MOSFET) devices, insulated gate bipolar transistor (IGBT) devices, and other similar power semiconductor devices as known to those of skill in the art. The individual N-type regions and P-type regions are not illustrated in FIGS. 2 and 4 so as to simplify the description of the present embodiment. By way of example, a MOSFET embodiment is described in more detail in FIG. 6.

In one embodiment, a layer of material 26 is disposed adjacent first major surface 12. In some embodiments, layer of material 26 can be one or more dielectric layers or materials configured to provide isolation and passivation of the active region 21. In one embodiment, layer of material 26 can be an oxide, a nitride, combinations thereof, or other similar materials as known to those of skill in the art. Layer of material 26 can have openings or vias (not shown) to provide electrical communication between active device region 21 and conductive layers 27 and 28 disposed over or adjacent to layer of material 26. In one embodiment, conductive layers 27 and 28 can be Al—Si alloys, Al/Ni/Au, Al/Ni/Cu, Cu/Ni/Au, Cu/Ni/Pd, Ti/Ni/Au, Ti/Cu/Ni/Au, Ti—W/Cu/Cu, Cr/Cu/Cu, Cr/Cu/Cu/Ni, Ni—V, Ti/Ni/Ag, Ti/Ni/Ag/Sn, or similar materials as known to those skilled in the art. Conductive layers 27 and 28 can be formed using deposition, sputtering, evaporation, plating, annealing, combinations thereof, and other similar processes as known to those of skill in the art. After formation, the layer can be patterned using, for example, photolithography and etch techniques. It is understood that in some embodiments, one or more masking layers or dielectric layers (not shown) may be included over portions of conductive layers 27 and 28 with openings provided for additional conductive connective structures, such as conductive clips or wires.

In accordance with the present embodiment, first semiconductor device 10 further includes a conductive layer or layers 19 disposed or affixed adjacent or along second major surface 13 including, for example, portions 131 and 132 and inner surfaces 141 of sidewall portions 14 as generally illustrated in FIG. 2. In other embodiments, some portions of second major surface 13 may not be covered by conductive layer 19. In some embodiments, conductive layer 19 comprises one or more conductive materials deposited or formed using sputtering, evaporation, plating, printing, deposition, dispensing, lift-off, combinations thereof, or other formation techniques as known to those skilled in the art. By way of example, conductive layer 19 can be a metal material, a conductive epoxy material, a solder material, a stencil material, combinations thereof, or other similar materials as known to those of skill in the art. In one embodiment, conductive layer 19 comprises an electroless plated material, such as electroless nickel.

In one embodiment, first semiconductor device 10 is configured as a high-side MOSFET for use in a DC/DC power regulation application. In accordance with the present embodiment, recessed portion 23 or recessed region 23 defined by recessed surface portion 16 and sidewall portions 14 provides an improvement in electrical performance by reducing the series resistance of body of semiconductor material 11 proximate to active device region 21. This improves, for example, Rdson performance. Also, sidewall portions 14 provide an electrical interconnect structure for the drain portion of first semiconductor device 10 to conductive substrate 80. Additionally, sidewall portions 14 provide stability for first semiconductor device 10 during manufacturing including while in wafer form as well as after the singulation process is completed.

In one embodiment, second semiconductor device 60 comprises a singulated semiconductor device 60, an insulated gate field effect transistor (IGFET) 60, MOSFET 60, power semiconductor device 60, or switching device 60. Second semiconductor device 60 includes a singulated body of semiconductor material 51, body of semiconductor material 51, or singulated semiconductor substrate 51, which, in one embodiment is formed from a semiconductor wafer that has been singulated along singulation lines to provide singulated edges 210. In one embodiment, singulated body of semiconductor material 51 includes a substrate portion 5100 and a semiconductor layer portion 5101, which in some embodiments can be an epitaxial layer.

Singulated body of semiconductor material 51 includes a first major surface 52 and a second major surface 53 opposite to first major surface 52. Second semiconductor device 60 can further include active device region 71 and, in some embodiments, termination regions 75, which are disposed adjacent first major surface 52 of singulated region of semiconductor material 51. In one embodiment, active device region 71 can include a plurality of N-type conductivity regions and/or a plurality of P-type conductivity regions configured to form power semiconductor device structures, such as insulated gate field effect transistor (IGFET) devices, metal-oxide semiconductor field effect transistors (MOSFET) devices, insulated gate bipolar transistor (IGBT) devices, and other similar power semiconductor devices as known to those of skill in the art. The individual N-type regions and P-type regions are not illustrated in FIGS. 2 and 4 so as to simplify the description of the present embodiment. By way of example, a MOSFET embodiment is described in more detail in FIG. 6.

In one embodiment, a layer of material 56 is disposed adjacent first major surface 52. In some embodiments, layer of material 56 can be one or more dielectric layers or materials configured to provide isolation and passivation of active device region 71. In one embodiment, layer of material 56 can be an oxide, a nitride, combinations thereof, or other similar materials as known to those of skill in the art. Layer of material 56 can have openings or vias (not shown) to provide electrical communication between active device region 71 and conductive layers 77 and 78 (illustrated in FIG. 4) disposed over or adjacent to layer of material 56. In one embodiment, a conductive layer 79 is disposed adjacent major surface 53. In one embodiment, conductive layers 77, 78 and 79 can be Al—Si alloys, Al/Ni/Au, Al/Ni/Cu, Cu/Ni/Au, Cu/Ni/Pd, Ti/Ni/Au, Ti/Cu/Ni/Au, Ti—W/Cu/Cu, Cr/Cu/Cu, Cr/Cu/Cu/Ni, Ni—V, Ti/Ni/Ag, Ti/Ni/Ag/Sn, or similar materials as known to those skilled in the art. Conductive layers 77, 78, and 79 can be formed using deposition, sputtering, evaporation, plating, annealing, combinations thereof, and other similar processes as known to those of skill in the art. Photolithographic and etch techniques can be used to pattern conductive layers 77 and 78. It is understood that a passivation layer(s) can be provided over conductive layers 77 and 78 with openings to facilitate electrical connections to second semiconductor device 60. In accordance with the present embodiment, conductive layer 77 is connected to conductive layer 19 of first semiconductor device 10 using a conductive material, such as solder, conductive epoxy, or other similar materials as known to those of skill in the art. In one embodiment, second semiconductor device 60 is configured as a low-side MOSFET for use in a DC/DC power regulation application. One advantage of the present embodiment is that recess portion 23 reduces the overall height of stacked semiconductor device structure 100, and the stacked configuration reduces the lateral size of the structure compared to previous designs.

With reference to FIGS. 2 and 3, conductive substrate 80 or conductive lead frame 80 includes a plurality of conductive leads, conductive lead structures, and/or conductive pads, such as conductive leads 81-87. In one embodiment, conductive lead 83 is configured as a conductive pad for supporting second semiconductor device 60. Conductive substrate 80 comprises a conductive material, such as metal. In one embodiment, conductive substrate 80 comprises a copper alloy material and can be formed using masking and etching/stamping techniques. Conductive leads 81 through 87 can be formed with half-etched portions (shown for example as element 831 in FIG. 4) configured to enhance the adhesion to package body 96. In one embodiment, conductive layer 27 is configured as a first current-carrying electrode for first semiconductor device 10 and is electrically connected to conductive lead 81 using a conductive connective structure 91. In one embodiment, conductive connective structure 91 can be a conductive clip. In accordance with one embodiment, conductive layer 19 is configured as a second current-carrying electrode for first semiconductor device and is electrically connected to conductive leads 82 and 84 as well as to conductive layer 77 of second semiconductor device 60. In other embodiments, conductive connective structure 91 can be one or more conductive wires. Conductive layer 28 can be configured as a first control electrode (e.g., a gate electrode) for first semiconductor device 10 and is electrically connected to conductive lead 86 using a conductive connective structure 92. In one embodiment, conductive connective structure 92 can be a conductive wire.

In one embodiment, conductive layer 77 can be configured as a first current-carrying electrode for second semiconductor device 60, and in one embodiment can be electrically connected to conductive lead 87 using, for example, a conductive connective structure 92 as illustrated in FIG. 5. In other embodiments, conductive layer 77 is not directly connected to one of the conductive leads of conductive substrate 80, and, in such an embodiment, conductive lead 87 can be eliminated. Conductive layer 79 can be configured as a second current-carrying electrode of second semiconductor device 60, and is attached to conductive lead 83. Conductive layer 78 can be configured as a control electrode (e.g., a gate electrode) for second semiconductor device 60 and can be electrically connected to conductive lead 85 using, for example, a conductive connective structure 92.

Package body 96 is provided to encapsulate first semiconductor device 10, second semiconductor device 60, conductive connective structures 91 and 92, and portions of conductive lead frame 80. As illustrated in FIGS. 2, 3, and 4, portions of conductive leads 81-87 are exposed to the outside through package body 96 to enable connecting stacked semiconductor device structure 100 to a next level of assembly, such as a printed circuit board. Package body 96 may be a polymer composite material, such as an epoxy mold compound for performing encapsulation through a molding process (e.g., overmolding or cavity molding), a liquid encapsulating member for performing encapsulation through a dispenser, or other insulating material(s) as known to those of skill in the art.

With reference to FIG. 5, stacked semiconductor device structure 100 is illustrated using the optional embodiment with first current-carrying electrode 77 of second semiconductor device 60 being electrically connected to conductive lead 87 using, for example, a conductive connective structure 92. In accordance with the present embodiment, this configuration provides for a way to monitor or sense the source characteristics of second semiconductor device 60 during operation at current-carrying electrode 77. This capability provides feedback to an associated driver device, which increases the efficiency of the system. In other embodiments, conductive lead 87 is not used. In further embodiments, current-carrying electrode 77 can be directly connected to an associated driver device (or other control device) that is co-packaged with stacked semiconductor device structure 100.

Figure 6:
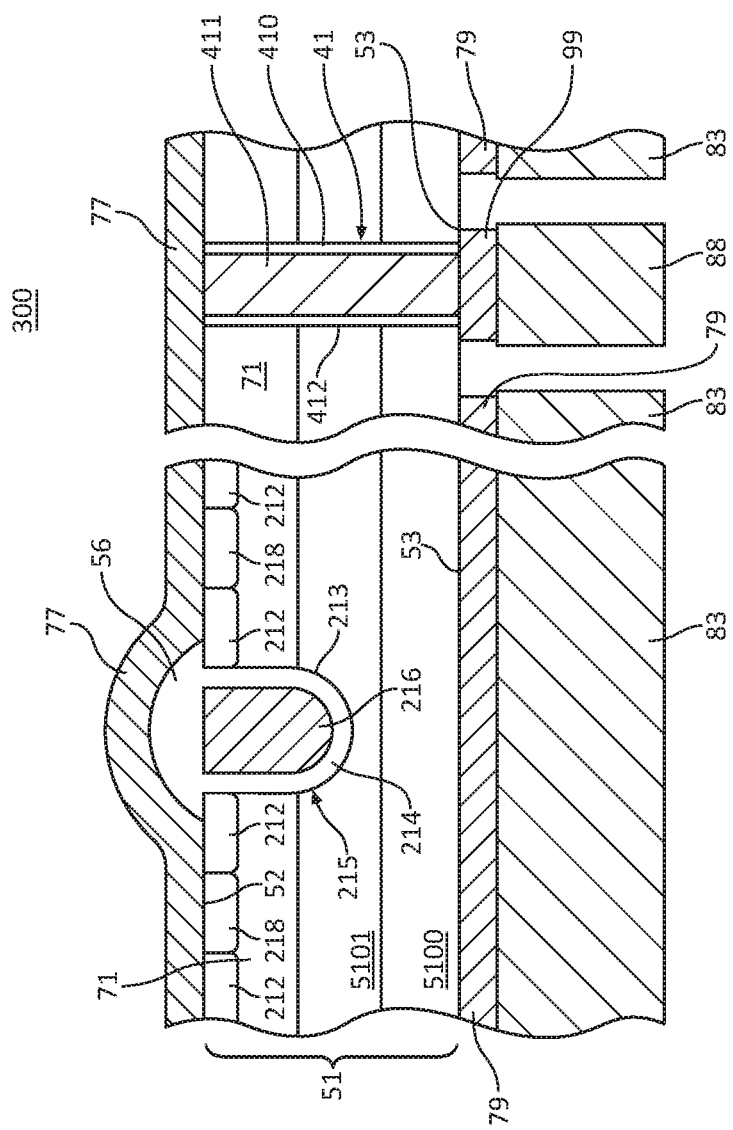
FIG. 6 illustrates a partial cross-sectional view of a MOSFET device in accordance with embodiments of the present invention.

FIG. 6 illustrates an enlarged partial cross-sectional view of an insulated gate field effect transistor device 300. Device 300 is an example of a power semiconductor device structure that can be used with first semiconductor device 10 and second semiconductor device 60, but the present description will use second semiconductor device 60 as an example embodiment. Device 300 can be among many of such devices disposed adjacent to first major surface 52 of second semiconductor device 60. In the present embodiment, body of semiconductor material 51 comprises substrate portion 5100, such as a heavily doped N-type substrate and semiconductor layer portion 5101, such as a lighter doped N-type semiconductor layer disposed between first major surface 52 and substrate portion 5100. In the present embodiment, active device region 71 is configured as a P-type doped region or body region for device 300. Active device region 71 further includes N-type doped regions 212, which can be configured as source regions for device 300, and P-type doped regions 218, which can be configured a contact regions. Device 300 further includes a trench control electrode structure 215, which includes a trench 213 extending from first major surface 52 into body of semiconductor material 51, a dielectric layer 214, and a conductive electrode 216 disposed adjacent to dielectric layer 214. Layer of material 56 isolates conductive electrode 216 from conductive layer 77, which in the embodiment illustrated, comprises a source electrode. In other embodiments, device 300 may further include a shielding electrode configuration.

In the present embodiment, conductive layer 79, which in the embodiment illustrated, comprises a drain electrode for second semiconductor device 60, and is further illustrated connected to conductive lead 83. In an alternate embodiment, second semiconductor device 60 can further include at least one through-semiconductor via 41, conductive via 41, through-silicon via 41, TSV 41, or through-substrate contact 41. In other embodiments, more than one conductive via is used. In one embodiment, conductive via 41 comprises trench 412 disposed in body of semiconductor material 51 and extends from first major surface 52 to second major surface 53. In one embodiment, conductive via 41 is lined with one or more insulating layers 410 disposed along sidewall portions of trench 412. A conductive material 411 is disposed within trench 412 adjacent to insulating layer(s) 410. In one embodiment, insulating layer 410 comprises an oxide material and conductive material 411 comprises a doped polycrystalline semiconductor material. In this embodiment, conductive via 41 is further connected to a conductive lead 88 through a patterned conductive layer 99, which is separated or electrically isolated from conductive layer 79. In accordance with the present embodiment, conductive via 41 and conductive lead 88 provide another structure for sensing the source characteristics of second semiconductor device 60. This capability provides feedback to an associated driver device, which can increase the efficiency of the system.

Figure 7:
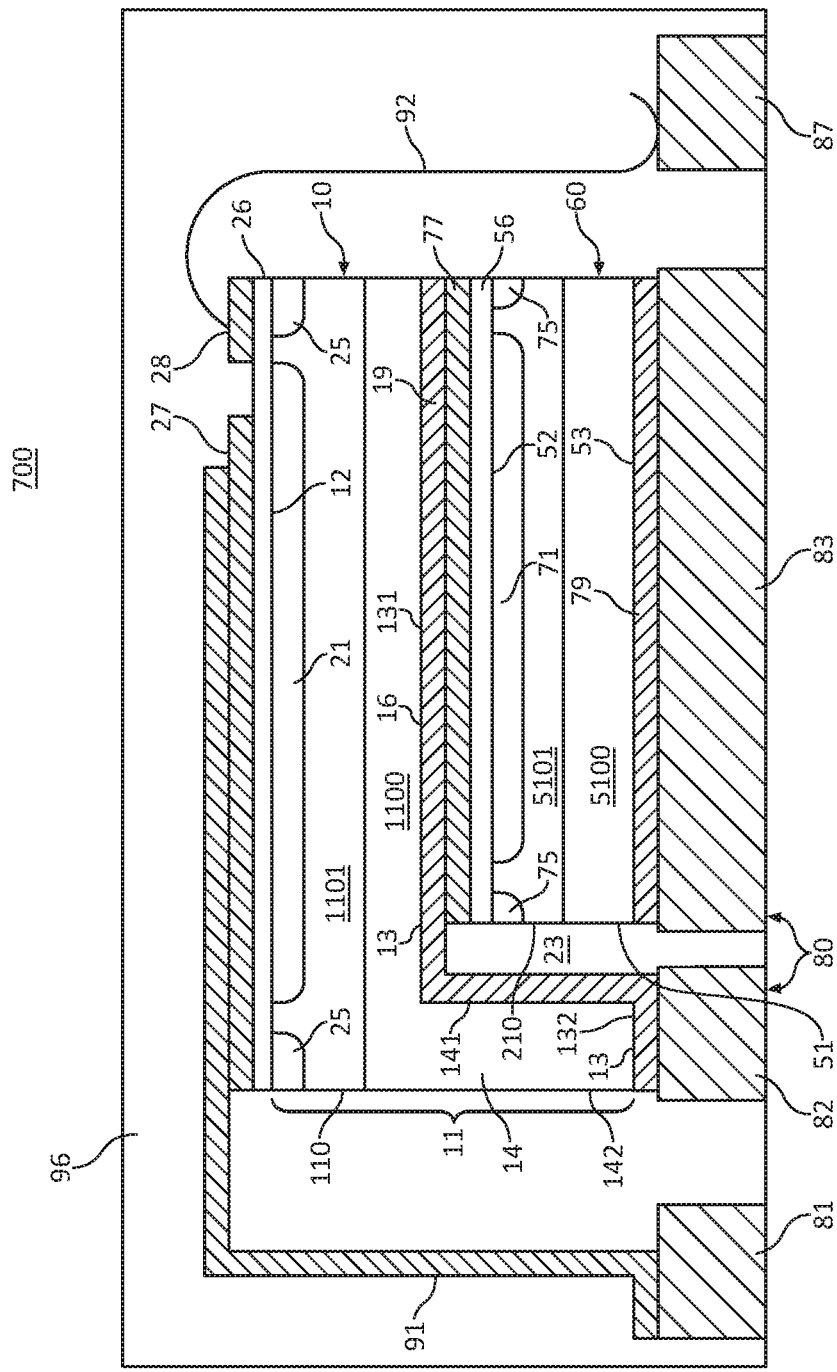
FIG. 7 illustrates a cross-sectional view of a stacked semiconductor device structure in accordance with an embodiment of the present invention.

FIG. 7 illustrates a cross-sectional view of a stacked semiconductor device structure 700 in accordance with another embodiment. Stacked semiconductor device structure 700 is similar to stacked semiconductor device structure 100, and only the differences will be described hereinafter. In accordance with the present embodiment, first semiconductor device 10 includes a single sidewall portion 14 disposed adjacent only one side of second semiconductor device 60. This embodiment provides for a smaller footprint compared to stacked semiconductor device structure 100 because conductive lead 84 can be eliminated. It is understood that stacked semiconductor device structure 700 may include source sensing structures, such as the configurations of FIGS. 2-5 using conductive lead 86 or FIG. 6 using conductive via 41 and conductive lead 88.

Figure 8:
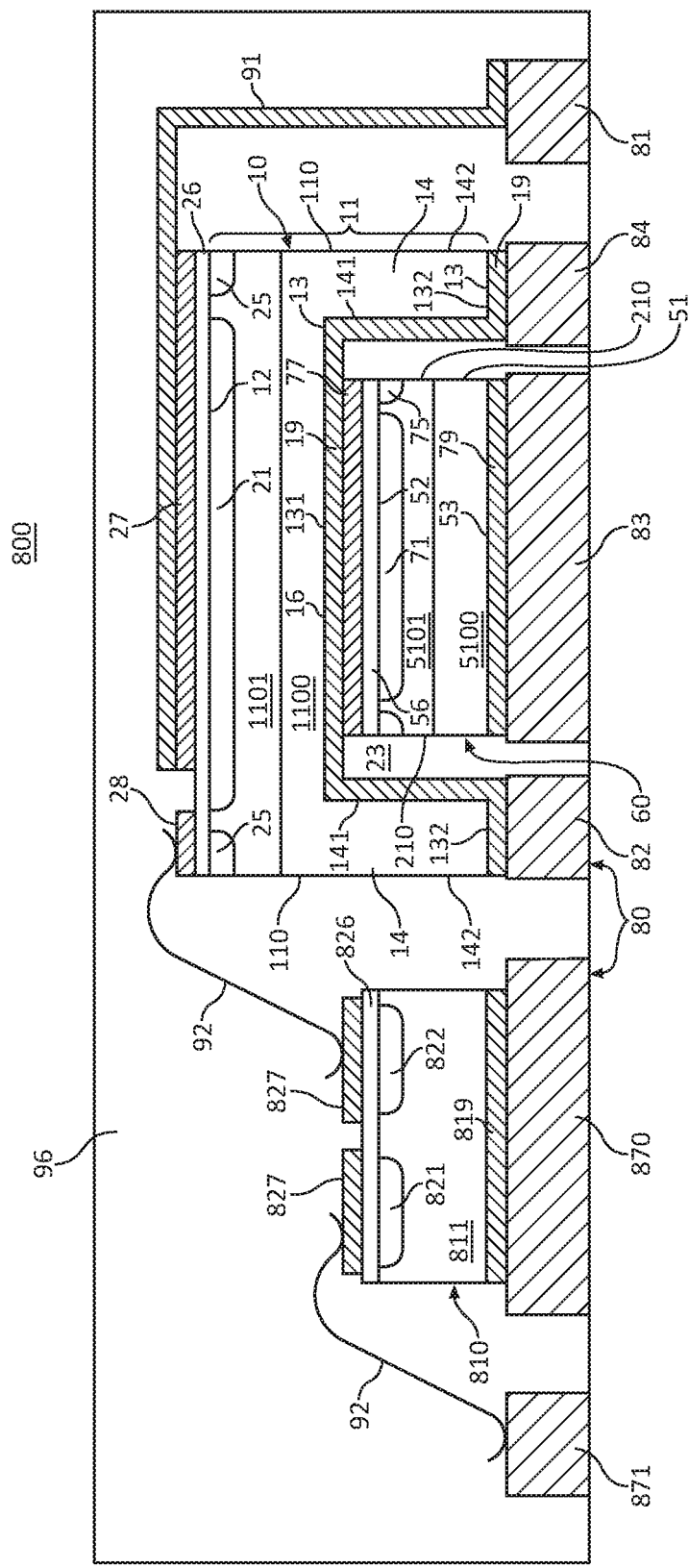
FIG. 8 illustrates a cross-sectional view of a stacked semiconductor device structure in accordance with an embodiment of the present invention.

FIG. 8 illustrates a cross-sectional view of a stacked semiconductor device structure 800 in accordance with another embodiment. Stacked semiconductor device structure 800 is similar to stacked semiconductor device structure 100, and only the differences will be described hereinafter. In accordance with the present embodiment, Stacked semiconductor device structure 800 further includes a driver device 810 or gate driver device 810 configured for controlling (e.g., driving on and off) first semiconductor device 10 and second semiconductor device 60 during operation. It is understood that driver device 810 is illustrated in simplified form, and can include, for example, a body of semiconductor material 811, active device regions 821 and 822 configured in a desired circuit pattern, insulating layer(s) 826 disposed adjacent active device regions 821 and 822, and contact regions 827 for passing electrical signals to and from driver device 810 to first semiconductor device 10 and/or second semiconductor device 60 through conductive connective structures 92 (only one connection is shown, but it is understood that an additional conductive connective structure 92 may be connected between driver device 810 and second semiconductor device 60 in another plane of the drawing) as well as to external circuitry (e.g., a PWM device) through conductive connective structure 92 and conductive lead 871. In one embodiment, driver device 810 can be connected to another conductive lead 870 using a conductive layer 819. In an alternative embodiment, layer 819 may be an insulating layer. Stacked semiconductor device structure 800 is an embodiment of an integrated solution having a smaller footprint than previous devices facilitated by the stacked configuration of first semiconductor device 10 and second semiconductor device 60. It is understood that stacked semiconductor device structure 800 may include source sensing structures, such as the configurations of FIGS. 2-5 using conductive lead 86 or FIG. 6 using conductive via 41 and conductive lead 88.

Figure 9:
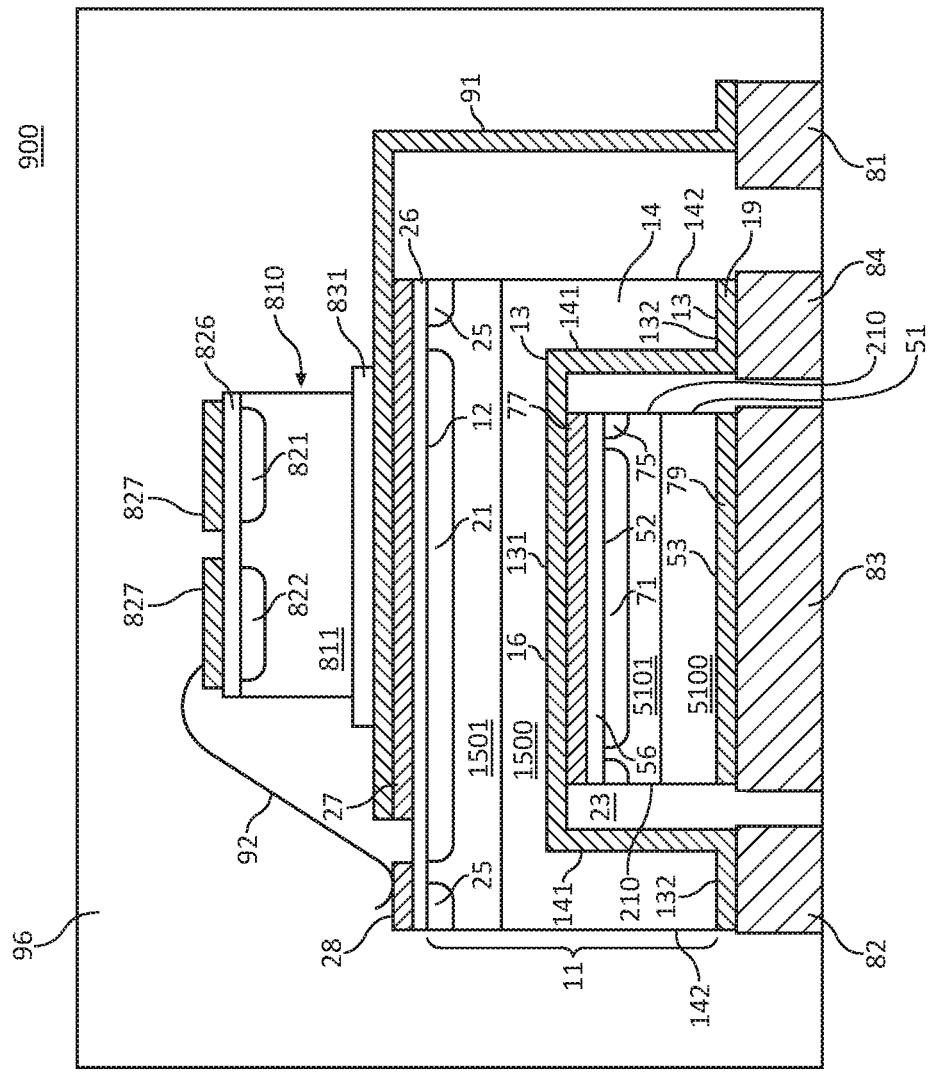
FIG. 9 illustrates a cross-sectional view of a stacked semiconductor device structure in accordance with an embodiment of the present invention.

FIG. 9 illustrates a cross-sectional view of a stacked semiconductor device structure 900 in accordance with another embodiment. Stacked semiconductor device structure 900 is similar to stacked semiconductor device structures 100 and 800, and only the differences will be described hereinafter. In the present embodiment, driver device 810 is disposed adjacent to an upper surface of conductive connective structure 91, and can be attached using, for example, an electrically insulating layer 831. In the present embodiment, driver device 810 is illustrated as electrically connected to control electrode 28 of first semiconductor device 10 using conductive connective structure 92. It is understood that driver device 810 can be further electrically connected to second semiconductor device 60 in another plane of the drawing as well as to an additional conductive lead(s). Stacked semiconductor device 900 is an embodiment of an integrated solution having a smaller footprint than previous devices facilitated by the stacked configuration of driver device 800, first semiconductor device 10, and second semiconductor device 60. It is understood that in other embodiments, additional semiconductor devices can be integrated within package body 96, and that the embodiment of FIG. 7 can be used as the stacked semiconductor device configuration. It is understood that stacked semiconductor device structure 900 may include source sensing structures, such as the configurations of FIGS. 2-5 using conductive lead 86 or FIG. 6 using conductive via 41 and conductive lead 88.

Turning now to FIGS. 10-15, a method of forming a first plurality of singulated semiconductor devices, such as a plurality of first semiconductor devices 10 will be described. More particularly, FIGS. 10-15 illustrate partial cross-sectional views of a semiconductor wafer 500 having a plurality of semiconductor devices 501 at various stages of fabrication. So as to not crowd the figures, certain details of each semiconductor device 501 are not included in FIGS. 10-15. Such details are illustrated, for example, in FIGS. 2, 4, 6, 7, 8, and 9.

Figure 10:
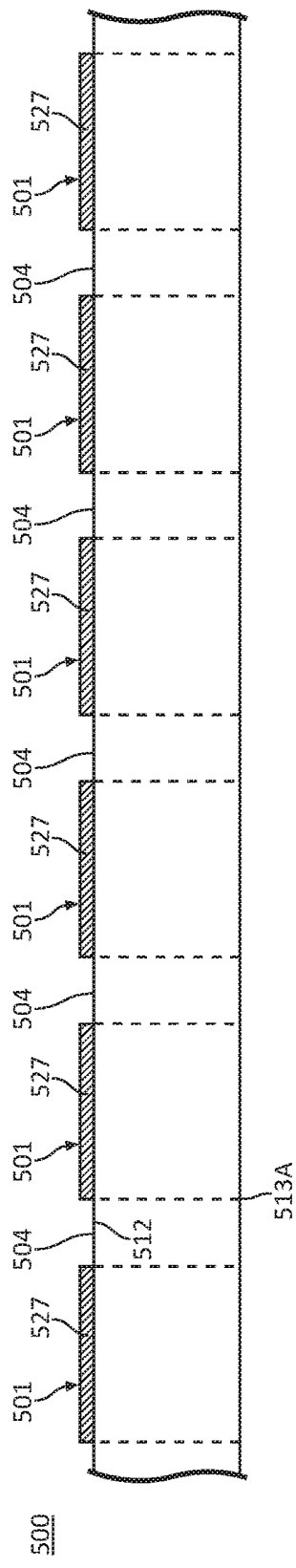
FIGS. 10-15 illustrate partial cross-sectional views of a semiconductor wafer having a plurality of semiconductor devices in accordance with a method of the present invention at various stages of fabrication.

FIG. 10 illustrates a partial cross-sectional view of semiconductor wafer 500 or semiconductor substrate 500 at an intermediate stage of fabrication. In one embodiment, semiconductor wafer 500 comprises a silicon substrate and has a thickness in a range from about 705 microns to about 745 microns for a 200 millimeter diameter substrate. In this embodiment, each of plurality of semiconductor devices 501 is separated by singulation lines 504 (represented by the vertically oriented dashed lines), which may be on the order of 5-20 microns wide when plasma singulation is used. Otherwise singulation lines 504 can be 35 microns through 75 microns if laser or saw singulation techniques are used. Semiconductor wafer 500 includes a first major surface 512 and a second major surface 513A opposite to first major surface 512. In one embodiment, a patterned conductive layer 527 is disposed adjacent to first major surface, which can be separated in part from first major surface 512 by a dielectric layer or layers (not shown).

Figure 11:
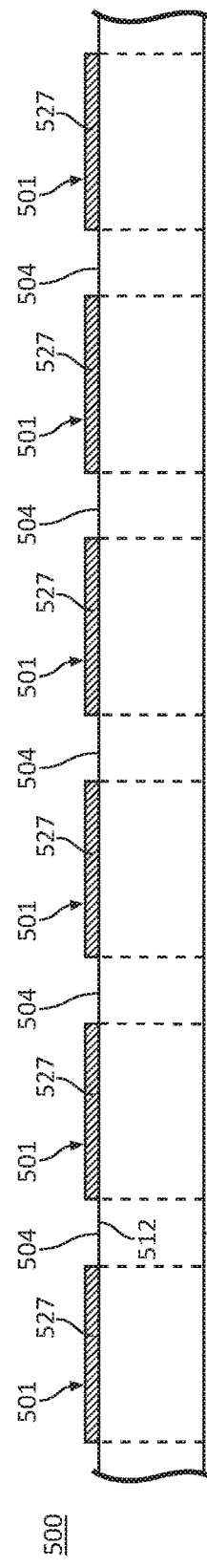

FIG. 11 illustrates a partial cross-sectional view of semiconductor wafer 500 after additional processing. In one embodiment, a portion of semiconductor wafer 500 is globally removed extending inward from original second major surface 513A to provide second major surface 513B. In one embodiment, a global removing process, such grinding, lapping, and/or etching can be used to remove a portion of semiconductor wafer 500 to provide second major surface 513B. In one embodiment, the thickness of semiconductor wafer 500 after the global removal process typically is in a range from 75 microns through about 150 microns.

Figure 12:
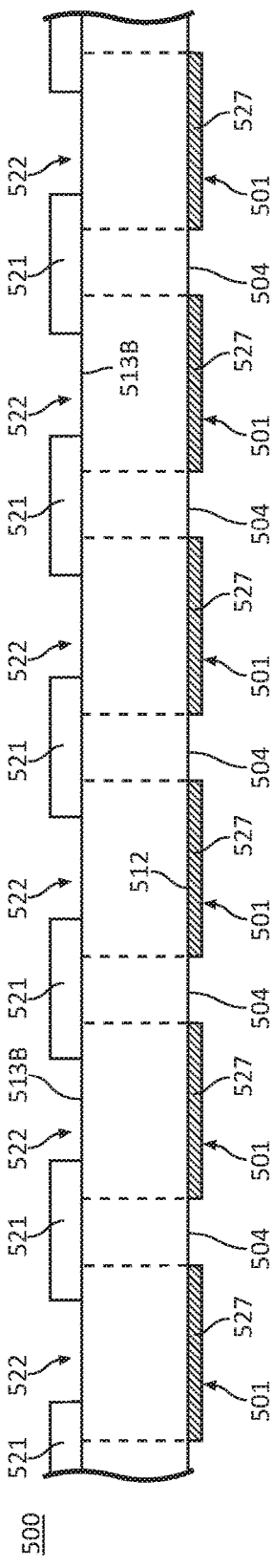

FIG. 12 illustrates a partial cross-sectional view of semiconductor wafer 500 after further processing. In one embodiment, semiconductor wafer 500 can be flipped or rotated such that first major surface 512 is oriented downward and second major surface 513B is oriented upward for further processing. In one embodiment, a masking layer 521 or masking structure 521 is provided adjacent to second major surface 513B. Masking layer 521 is configured with a plurality of openings 522 that extend through or at least partially through masking layer 521 in a preselected pattern to expose portions of second major surface 513B. Openings 522 can be provided using, for example, a double-sided photolithographic alignment tool to properly align each opening 522 to a corresponding active device region provided adjacent first major surface 512. In accordance with the present embodiment, openings 522 can have a variety of shapes including, for example, square shapes, rectangular shapes, polygonal shapes, round shapes, and random shapes. Moreover, the placement of openings 522 can be substantially centrally aligned to each semiconductor device 501, or the placement can be offset towards one or more sides of each semiconductor device 501. Further, it is understood that masking layer 521 can be configured to provide each semiconductor device 501 with multiple sidewall portions or with a single sidewall portion.

In one embodiment, masking layer 521 comprises a polymer layer, such as a photoresist layer or a polyimide layer. In another embodiment, masking layer 521 comprises a dielectric material, such as an oxide, or masking layer 521 comprises a conductive material, such as a metal. In accordance with the present embodiment, masking layer 521 is configured such that portions of masking layer 521 overlap or cover singulation lines 504 as well as portions of semiconductor devices 501 adjoining singulation lines 504. In accordance with the present embodiment, those portions semiconductor devices 501 covered by masking layer 521 correspond to sidewall portions 5141 for each semiconductor device 501, which will be formed in a subsequent operation of the present method.

Figure 13:
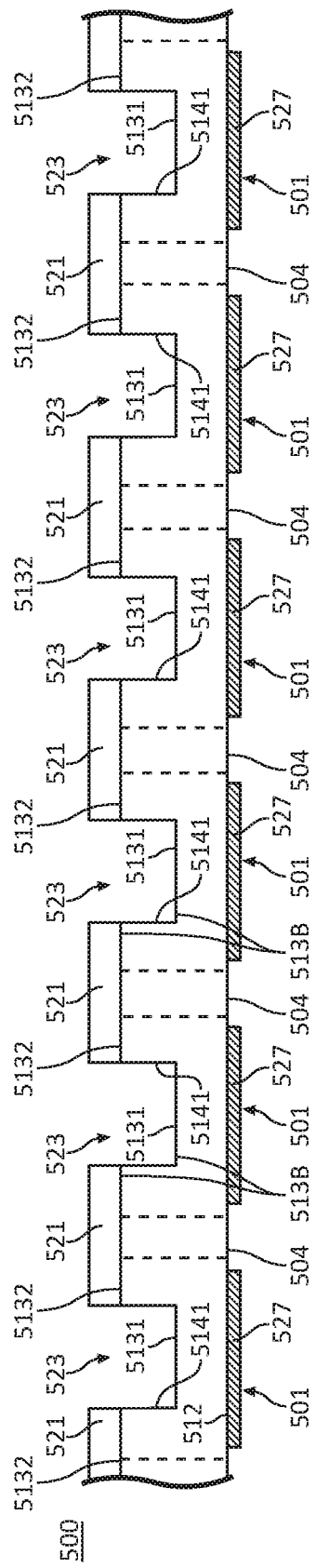

FIG. 13 illustrates a partial cross-sectional view of semiconductor wafer 500 after still further processing. In accordance with the present embodiment, portions of semiconductor wafer 500 exposed through opening 522 of masking layer 521 are removed to provide recessed portions 523 or keyed portions 523, which have a shape similar to or defined by openings 522. In accordance with the present embodiment, recessed portions 523 are defined by portion 5131 of second major surface 513B and sidewall portions 5141, which extend between portion 5131 and another portion 5132 of second major surface 513B. In some embodiments, recessed portions 523 are formed using plasma etching techniques and a chemistry that selectively etches silicon at a much higher rate than that of dielectrics and/or other masking materials. In one embodiment, semiconductor wafer 500 can be etched using a process commonly referred to as the Bosch process. In other embodiments, recessed portions 523 can be formed using wet etch techniques. By way of example, sidewall portions 5141 can have a height (i.e., distance between portions 5132 and 5131) in a range from about 50 microns through about 100 microns. In the present embodiment, masking layer 521 can be removed after recessed portions 523 are provided. It is understood that conductive layer 527 can be provided as well at this stage of fabrication instead of earlier. Also, it is understood that sidewall portions 5141 can be provided on one, two, three, or four sides of one or more semiconductor devices 501 using a desired and preselected masking scheme to provide masking layer 521. Further, sidewall portions 5141 can be provided with inner sidewall surfaces having sloped or curved shapes in cross-sectional view.

Figure 14:
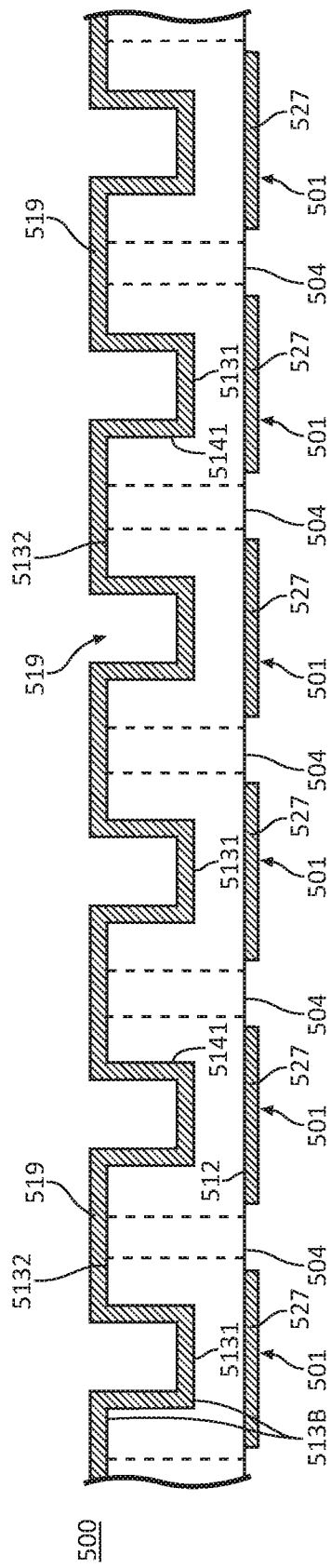

FIG. 14 illustrates a partial cross-sectional view of semiconductor wafer 500 after additional processing. In one embodiment, after masking layer 521 is removed, conductive layer 519 is provided disposed adjacent or along second major surface 513B including portions 5131 and 5132 and the sidewalls of sidewall portions 5141. By way of example, conductive layer 519 can be formed using conductive deposition techniques, such as evaporation, sputtering, or other techniques as known to those of skill in the art. In one embodiment, evaporation is used to provide conductive layer 519 having a generally uniform thickness along the surfaces of second major surface 513B. In some embodiments, electrochemical deposition processes, such as plating processes can be used to form conductive layer 519. Such processes include, for example, electroless plating and electroplating processes. In other embodiments, combinations of deposition techniques may be used to form conductive layer 519. In one embodiment, conductive layer 519 can have a thickness greater than about 10.0 microns and can be a metal, such as Cu/Ni, Cu/Ni/Au, Ti/Ni/Au, Ti/Ni/Ag, Ti/Ni/Ag/Sn, Cr/Ni/Au, Cr/Ni/Ag, or other similar conductive materials as known to those of skill in the art.

Figure 15:
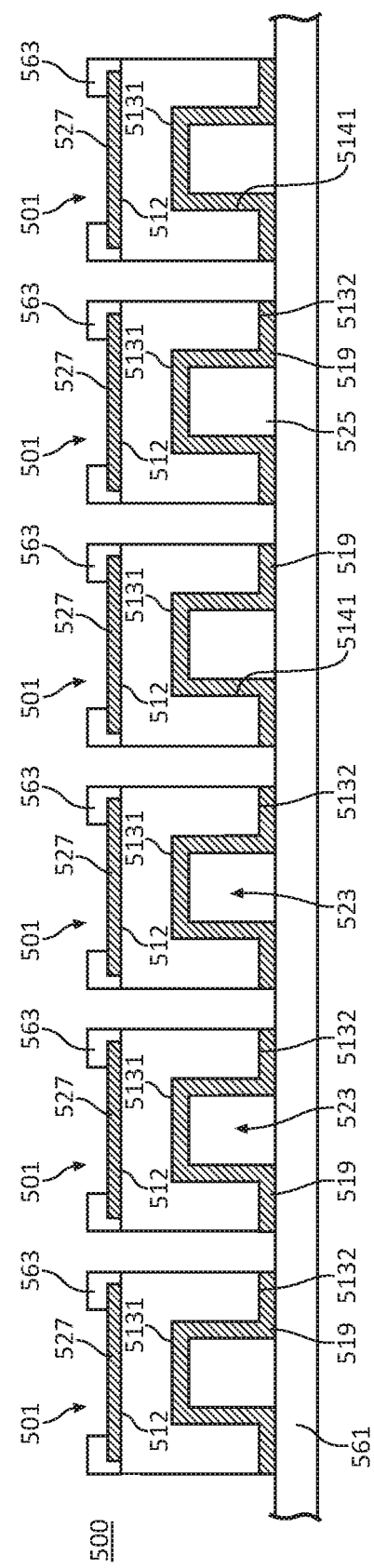

FIG. 15 illustrates a partial cross-sectional view of semiconductor wafer 500 after still further processing. In one embodiment, semiconductor wafer 500 is attached to a carrier substrate 561, such as a carrier tape attached to a supporting frame. More particularly, conductive layer 519 can be placed or affixed to carrier substrate 561 as generally illustrated in FIG. 15. In one preferred embodiment, semiconductor wafer 500 and carrier substrate 561 are placed within a plasma etching chamber and plasma etching is used to remove portions of semiconductor wafer 500 in singulation lines 504 to provide a plurality of singulated semiconductor devices 501. In some embodiments, a protective masking layer 563 can be formed overlying at least portions of first major surface 512 with openings formed proximate to singulation lines 504 before etching semiconductor wafer 500. Masking layer 563 can be a polymer layer, a dielectric layer, or other suitable protective materials as known to those of skill in the art.

The etching process can be performed using a chemistry that selectively etches silicon at a much higher rate than that of polymers, dielectrics and/or metals. In one embodiment, semiconductor wafer 500 can be etched using the Bosch process. In one embodiment, semiconductor wafer 500 can be etched using the Bosch process in a deep reactive ion etch system. In one embodiment, the width of singulation lines 504 can be from about 5 microns to about 20 microns. Such a width is sufficient to ensure that the openings that form singulation lines 504 can be formed completely through semiconductor wafer 500 as generally illustrated in FIG. 15. In one embodiment, singulation lines 504 can be formed in about 5 to about 30 minutes using the Bosch process. A suitable etch apparatus is available from Plasma-Therm of St. Petersburg, Fla., U.S.A. In order to separate conductive layer 519 within singulation lines 504, a separate removal process can be used, including those described in U.S. Pat. Nos. 8,664,089, 9,034,733, and 9,136,173, which are incorporated by reference herein. In other embodiments, laser and/or saw singulation methods can be used with singulation lines 504 being wider—for example, 35 microns through 75 microns wide. In further steps, plurality of singulated semiconductor devices 501 can be removed from carrier substrate 561 and combined with second semiconductor devices 60, conductive substrate 80, and package body 96 in accordance with, for example, the embodiments illustrated in FIGS. 2-5 and 7-9.

Figure 16:
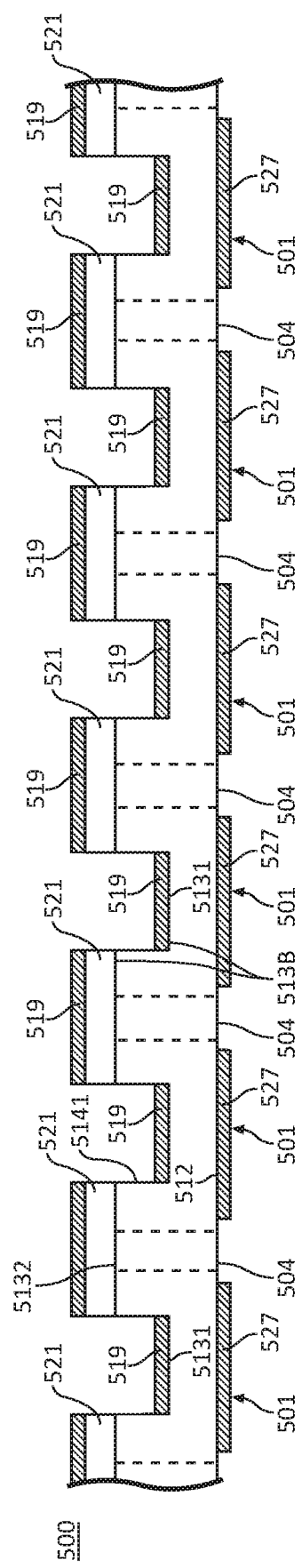
FIGS. 16-17 illustrate partial cross-section views of a semiconductor wafer having a plurality of semiconductor device in accordance with an alternative method of the present invention.

FIG. 16 illustrates a partial cross-sectional view of semiconductor wafer 500 in accordance with alternative method. In one embodiment, after semiconductor wafer 500 has been processed in accordance with FIGS. 10-13, masking layer 521 is left in place. Next, conductive layer 519 is provided disposed adjacent or along portion 5131 of second major surface 513B and disposed adjacent masking layer 521. In one embodiment, a directional deposition process, such as physical deposition process (for example, evaporation) can be used to form conductive layer 519. In one embodiment, conductive layer 519 can have a thickness greater than about 10.0 microns and can be a metal, such as Cu/Ni, Cu/Ni/Au, Ti/Ni/Au, Ti/Ni/Ag, Ti/Ni/Ag/Sn, Cr/Ni/Au, Cr/Ni/Ag, or other similar conductive materials as known to those of skill in the art. In some embodiments, electrochemical deposition processes, such as plating processes can be used to form conductive layer 519. In other embodiments, combinations of deposition techniques may be used to form conductive layer 519. Such processes can be selected to provide conductive layer 519 disposed adjacent or along the inner sidewall surfaces of sidewall portions 5141.

Figure 17:
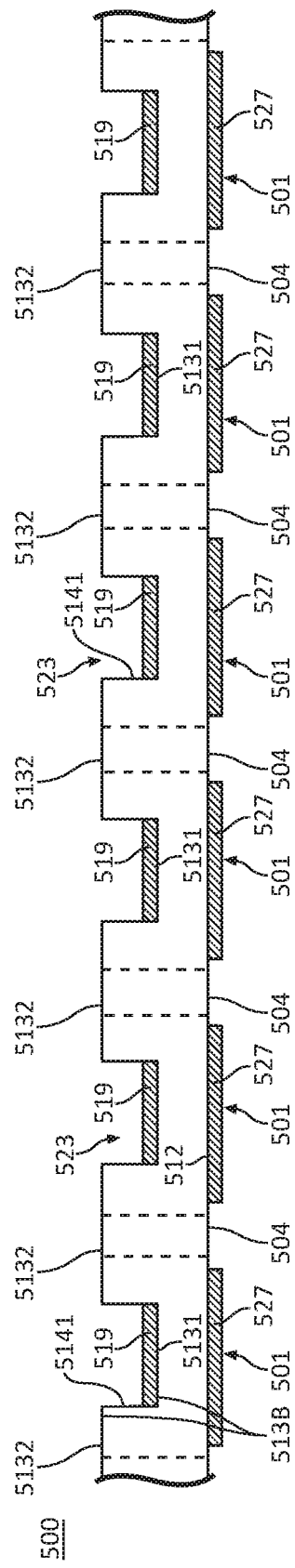

FIG. 17 illustrates a partial cross-sectional view of semiconductor wafer 500 after further processing. In one embodiment, a lift-off process is used to remove masking layer 521, which also removes that portion of conductive layer 519 disposed adjacent to masking layer 521. In one embodiment, a solvent is used configured to dissolve masking layer 521, but not damage conductive layer 519 disposed adjacent portions 5131 of second major surface 513B. Semiconductor wafer 500 can then processed in accordance with FIG. 15 with portions 5132 of second major surface 513B placed adjacent carrier substrate 561.

Figure 18:
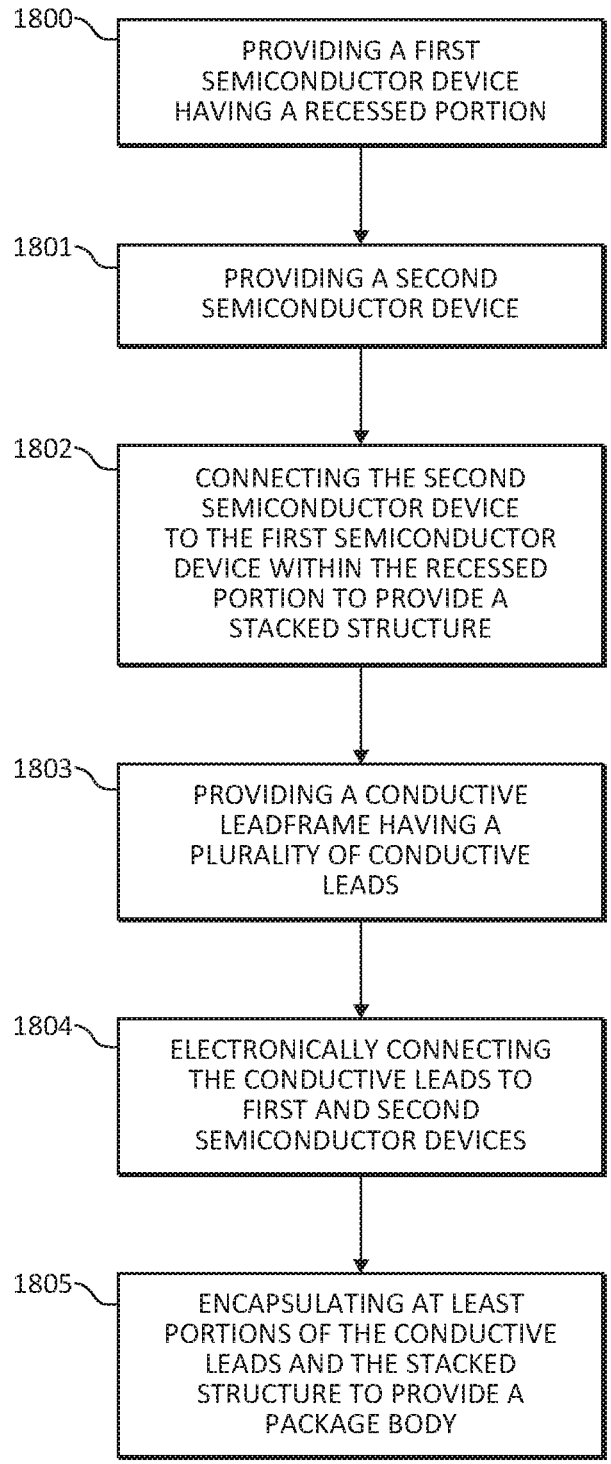
FIG. 18 illustrates a flow chart that describes a method for forming a stacked semiconductor device structure in accordance with the present invention.

Turning now to FIG. 18, which illustrates a flow chart describing a method for forming a stacked semiconductor device structure in accordance with one embodiment. In step 1800, the plurality of semiconductor devices 501 can be provided after the step illustrated in FIG. 15. In one embodiment, a pick-and-place tool can be used to remove one of semiconductor devices 501 from carrier substrate 561 thereby providing a first semiconductor device 10 having a recessed portion 23. In step 1801, second semiconductor device 60 can be provided using, for example, a pick-and-place tool to remove second semiconductor device 60 from a carrier substrate similar to first semiconductor device 10. In step 1802, second semiconductor device 60 can be connected to first semiconductor device 10 physically within recessed portion 23 to provide a stacked semiconductor device structure, such as stacked semiconductor device structure 100. In one embodiment, second semiconductor device 60 can be attached to first semiconductor device 10 using a solder material, a conductive epoxy, or other conductive attachment material(s) as known to those of skill in the art.

In step 1803, a conductive substrate 80 having a plurality of conductive leads is provided. In one embodiment, conductive substrate 80 comprises a conductive lead frame, which can be fabricated from a conductive material, such as a copper-based material, a copper alloy-based material, steel, non-ferrous, or an alloy material such as Alloy 42 having suitable conductive metal plating layers applied thereto. Conductive substrate 80 can be fabricated using masking, etching and/or stamping techniques.

In step 1804, the stacked semiconductor device structure and conductive substrate 80 are electrically connected. In one embodiment, and as illustrated previously in FIG. 2, conductive layer 79 is connected to conductive lead 83 and sidewall portions 14 having conductive layer 19 are connected to conductive leads 82 and 84 using, for example, a solder material, a conductive epoxy, or other conductive attach materials as known to those of skill in the art. Also, other portions of the stacked semiconductor device structure are electrically connected to other conductive leads as described previously using conductive connective structures, such as conductive wires 91 and/or conductive clip 92. In an alternative embodiment, second semiconductor device 60 is first attached to conductive substrate 80 and then first semiconductor device 70 is attached to second semiconductor device 60 and conductive substrate 80. In other embodiments, driver device 810 and/or other electronic devices can be provided and connected to the stacked semiconductor device structure and conductive substrate 80 as described previously.

In step 1805, the sub-assembly comprising first semiconductor device 10, second semiconductor device 60, conductive substrate 80, and conductive connective structures 91/92 can be placed in a molding apparatus and package body 96 is formed encapsulating the sub-assembly. In one embodiment, package body 96 encapsulates first semiconductor device 10, second semiconductor device 60, conductive connective structures 91/92, and at least portions of conductive substrate 80. In some embodiments, portions of conductive substrate 80, such as lower surface portions of the conductive leads, are exposed to the outside through package body 96 as described previously. This facilitates the attachment of the package semiconductor device to a next level of assembly, such as a printed circuit board, and to facilitate the routing of electrical signals to and from the semiconductor devices encapsulated within package body 96.

Figure 19:
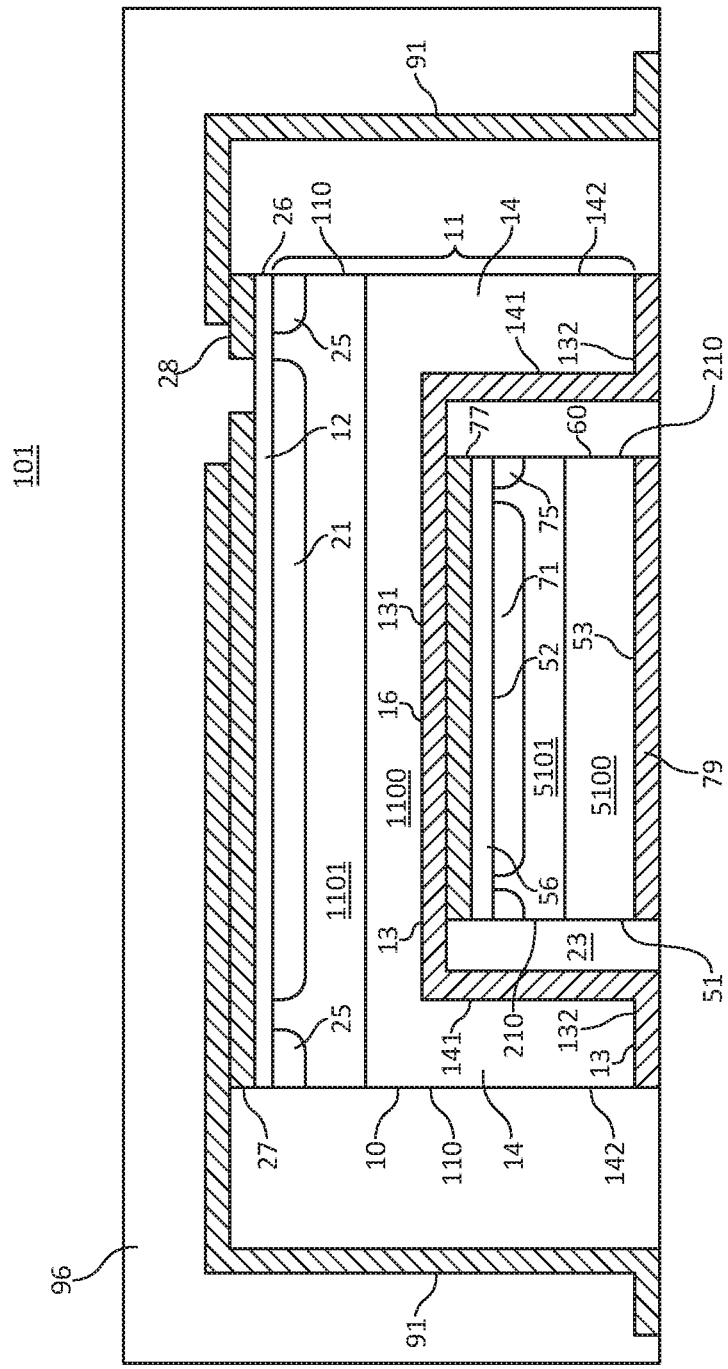
FIG. 19 illustrates an enlarged cross-sectional view of a stacked semiconductor device structure in accordance with an embodiment of the present invention.

FIG. 19 illustrates an enlarged cross-sectional view of a stacked semiconductor device structure 101 in accordance with another embodiment. Stacked semiconductor device structure 101 is similar to stacked semiconductor device structure 100, and only the differences will be described hereinafter. In accordance with the present embodiment, stacked semiconductor device structure 101 is provided absent or without conductive substrate 80. In the present embodiment, another conductive clip structure 92 is electrically connected to conductive layer 28 of first semiconductor device 10, and portions of conductive clips 92, first semiconductor device 10, and second semiconductor device 60 are exposed to the outside of package body 96 to facilitate inputting and outputting electrical signals to first semiconductor device 10 and second semiconductor device 60. In one embodiment, first semiconductor device 10, second semiconductor device 60, and conductive connective structures 92 are assembled on a temporary carrier (not shown), such as high temperature tape or temporary lead frame. The assembly can then be molded to provide package body 96, and then the temporary carrier removed to provide stacked semiconductor device structure 101.

From all of the foregoing, one of skill in the art can determine that in accordance with one embodiment, at least two semiconductor die are stacked on top of each other where at least one semiconductor die is etched in the Z direction to form a recessed region, and another semiconductor die is physically disposed within the recessed region. The semiconductor die having the recessed portion is further configured with an interconnect portion, such as a sidewall portion, which can be connected to a next level of assembly.

From all of the foregoing, one of skill in the art can determine that in accordance with another embodiment, the first semiconductor device and the second semiconductor device comprise MOSFETs, the second semiconductor device is bounded on a first pair of opposing sides by the sidewall portions, and a second pair of opposing sides of the second semiconductor device extend laterally away from edges of the first semiconductor device.

In view of all of the above, it is evident that a novel method and structure is disclosed. Included, among other features, is a singulated semiconductor device having a recessed major surface opposite to active major surface where device regions are provided. The recessed major surface includes a recessed surface bounded by sidewall portions to define a recessed portion. A conductive layer is disposed adjacent at least the recessed surface. The recessed surface improves the electrical performance of the singulated semiconductor device. Another singulated semiconductor device is disposed within the recessed portion to provide a stacked semiconductor device structure. The stacked semiconductor device structure can be used in a DC/DC buck regulator configuration and has benefits including a reduced footprint and improved electrical performance (e.g., reduced resistance and/or reduced parasitics).

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, planar gate structure may be used in addition to or in place of trench gate structures. Also, other semiconductor materials in addition to or instead of silicon may be used.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

We claim:

1. A method of forming stacked semiconductor device structure comprising:
   providing a first semiconductor device comprising:
      a first major surface and a second major surface opposite to the first major surface, wherein:
         the second major surface comprises a recessed region bounded by sidewall portions; and
         the sidewall portions have outer surfaces defining peripheral edge segments of the first semiconductor device; and
      a first conductive layer disposed over the recessed region, wherein the first conductive layer is a continuous layer that covers each of the sidewall portions and at least two segments of the second major surface between the recessed region and the peripheral edge segments;
   providing a second semiconductor device comprising a third major surface and a fourth major surface opposite to the third major surface; and
   electrically coupling a first portion of the second semiconductor device to the first conductive layer within the recessed region such that at least a portion of the second semiconductor device is disposed within the recessed region.

2. The method of claim 1, wherein:
   providing the first semiconductor device comprises providing a first singulated region of semiconductor material having the first major surface and the second major surface; and
   providing the second semiconductor device comprises providing a second singulated region of semiconductor material having the third major surface and the fourth major surface.

3. The method of claim 1 further comprising:
   providing a conductive lead frame comprising conductive lead structures;
   electrically coupling the sidewall portions to a first conductive lead structure and a second conductive lead structure respectively;
   electrically coupling the fourth major surface to a third conductive lead structure;
   electrically coupling a portion of the first semiconductor device to a fourth conductive lead structure; and
   providing a package body encapsulating at least portions of the conductive lead frame, the first semiconductor device, and the second semiconductor device, wherein:
      portions of the first conductive lead structure, the second conductive lead structure, the third conductive lead structure, and the fourth conductive lead structure are exposed to an outside of the package body.

4. The method of claim 3 further comprising:
   electrically coupling another portion of the first semiconductor device to a fifth conductive lead structure; and
   electrically coupling a second portion of the second semiconductor device to a sixth conductive lead structure.

5. The method of claim 4 further comprising:
   electrically coupling a third portion of the second semiconductor device to a seventh conductive lead structure, wherein:
   forming the package body comprises providing portions of the fifth conductive lead structure, the sixth conductive lead structure, and the seventh conductive lead structure exposed to the outside of the package body.

6. The method of claim 4, wherein:
   electrically coupling the second portion of the second semiconductor device to the sixth conductive lead structure comprises electrically coupling using a through-semiconductor via disposed within the second semiconductor device.

7. The method of claim 3 further comprising:
   electrically coupling a third semiconductor device to one or more of a first control electrode of the first semiconductor device and a second control electrode of the second semiconductor device.

8. The method of claim 7, wherein:
   electrically coupling the portion of the first semiconductor device to the fourth conductive lead structure comprises electrically coupling with a conductive clip; and
   the method further comprises attaching the third semiconductor device to the conductive clip.

9. The method of claim 1, wherein:
   the recessed region is bounded by only two sidewall portions; and
   the second semiconductor device extends outside of the recessed region.

10. The method of claim 1, wherein:
    providing the first semiconductor device comprises providing a first MOSFET device; and
    providing the second semiconductor device comprises providing a second MOSFET device.

11. A method of forming a stacked semiconductor device comprising:
    providing a stacked semiconductor die structure comprising:
       a first semiconductor die having a recessed portion extending inward from a major surface and a first conductive layer disposed within the recessed portion; and
       a second semiconductor die electrically coupled to the first semiconductor die within the recessed portion;
    providing a conductive substrate comprising a plurality of leads; and
    electrically coupling the first semiconductor die and the second semiconductor die to the conductive substrate; and
    providing a package body encapsulating at least a portion of the conductive substrate and at least portions of the stacked semiconductor die structure, wherein:
       electrically coupling comprises attaching a first portion of the first semiconductor die to a first lead and attaching a first portion of the second semiconductor die to a second lead; and
       providing the package body comprises exposing portions of the plurality of leads to an outside of the package body.

12. The method of claim 11, wherein:
providing the stacked semiconductor die structure comprises providing the recessed portion bounded by sidewall portions having outward facing surfaces defining peripheral edge segments of the first semiconductor die; and
electrically coupling comprises electrically coupling the first conductive layer to two of the plurality of leads.

13. The method of claim 12, wherein:
providing the stacked semiconductor die structure comprises providing the first conductive layer disposed over the recessed region including the sidewall portions within the recessed portion and segments of the major surface between the recessed portion and the peripheral edge segments.

14. The method of claim 11, wherein:
providing the stacked semiconductor die structure comprises providing the first semiconductor die with the recessed region bounded by sidewall portions; and
attaching the first portion of the first semiconductor die to the first lead comprises attaching one of the sidewall portions to the first lead.

15. The method of claim 11 wherein:
electrically coupling the first semiconductor die comprises electrically coupling with a conductive clip structure; and
the method further comprises attaching a third semiconductor die to a surface of the conductive clip structure.

16. A method of forming a stacked semiconductor device structure comprising:
providing a semiconductor substrate having a first major surface and a second major surface opposite to the first major surface and a first semiconductor device formed as part of the semiconductor substrate;
forming a recessed region extending inward from the second major surface;
providing a first conductive layer within the recessed region; and
singulating the semiconductor substrate to provide the first semiconductor device as a singulated structure; and
electrically coupling a second semiconductor device to the first conductive layer within the recessed region, wherein:
providing the semiconductor substrate comprises providing the first semiconductor device disposed adjacent the first major surface;
forming the recessed region comprises forming the recessed region bounded by sidewall portions, each sidewall portion extending outward from a recessed surface portion;
singulating comprises singulating through the sidewall portions;
electrically coupling the second semiconductor device comprises:
providing the second semiconductor device having a third major surface and a fourth major surface opposite to the third major surface; and
electrically coupling the third major surface of the second semiconductor device to the first conductive layer within the recessed region; and
the method further comprises:
providing a conductive lead frame comprising a plurality of conductive lead structures;
electrically coupling a first sidewall portion to a first conductive lead structure; and
electrically coupling the fourth major surface to a second conductive lead structure.

17. The method of claim 16 further comprising forming a package body encapsulating at least portions of the first semiconductor device and the second semiconductor device.

18. The method of claim 17, wherein:
forming the package body comprises exposing portions of the plurality of conductive lead structures to an outside of the package body.

19. The method of claim 16, further comprising:
electrically coupling the third major surface of the second semiconductor device to a third conductive lead structure using a through-substrate via disposed within the second semiconductor device.

20. The method of claim 16 further comprising:
providing a third semiconductor device; and
electrically coupling the third semiconductor device to one or more of the first semiconductor device and the second semiconductor device.

* * * * *